(12) United States Patent
Guo et al.

(10) Patent No.: US 11,282,680 B2
(45) Date of Patent: Mar. 22, 2022

(54) BEARING DEVICE AND PLASMA PROCESSING APPARATUS (71) Applicant: BEIJING NAURA MICROELECTRONICS EQUIPMENT CO., LTD., Beijing (CN)

(72) Inventors: Hao Guo, Beijing (CN); Peng Chen, Beijing (CN); Jue Hou, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 335 days.

(21) Appl. No.: 15/119,658

(22) PCT Filed: Dec. 19, 2014

(86) PCT No.: PCT/CN2014/094359
§ 371 (c)(1),
(2) Date: Aug. 17, 2016

(87) PCT Pub. No.: WO2015/124025
PCT Pub. Date: Aug. 27, 2015

(65) Prior Publication Data
US 2017/0011892 A1 Jan. 12, 2017

(30) Foreign Application Priority Data
Feb. 24, 2014 (CN) .......................... 201410061908.3

(51) Int. Cl.
H01J 37/32 (2006.01)
C23C 14/22 (2006.01)
(Continued)

(52) U.S. Cl.
CPC ........ *H01J 37/32715* (2013.01); *C23C 14/22* (2013.01); *C23C 14/50* (2013.01);
(Continued)

(58) Field of Classification Search
USPC ................. 118/728–733; 156/345.51–345.55
See application file for complete search history.

(56) References Cited

U.S. PATENT DOCUMENTS 5,262,029 A 11/1993 Erskine et al.
5,660,699 A * 8/1997 Saito ...................... C25D 17/06
204/297.03
(Continued)

FOREIGN PATENT DOCUMENTS

CN 1896298 A 1/2007
CN 102157425 A 8/2011
(Continued)

OTHER PUBLICATIONS

PCT/CN2014/094359 International Search Report dated March 9, 2015; 2 pgs.

*Primary Examiner* — Karla A Moore
*Assistant Examiner* — Tiffany Z Nuckols
(74) *Attorney, Agent, or Firm* — Anova Law Group, PLLC (57) ABSTRACT Embodiments of the invention provide a bearing device and a plasma processing apparatus. According to at least one embodiment, the bearing device includes a base, a base driving mechanism, a pressing ring and a baffle ring. The base is used for bearing a workpiece to be processed; the base driving mechanism is used for driving the base to move up to a process position or down to a loading and unloading position; the pressing ring is used for clamping an edge region of the workpiece to be processed on the base when the base is at the process position; the baffle ring surrounds
(Continued)

an outer peripheral wall of the base and is located under the pressing ring; surfaces of the pressing ring and the baffle ring opposite to each other include a pair of guiding tori, which are inclined outwardly at a same angle with respect to a centerline of the base in a vertical direction; and, during the process of driving the base to move up by the base driving mechanism, the guiding tori contact and move toward each other, so as to achieve positioning of the pressing ring and the base.

14 Claims, 5 Drawing Sheets

(51) Int. Cl.
    *C23C 16/50*     (2006.01)
    *H01L 21/687*     (2006.01)
    *C23C 14/50*     (2006.01)
    *H01J 37/20*     (2006.01)

(52) U.S. Cl.
    CPC .............. *C23C 16/50* (2013.01); *H01J 37/20* (2013.01); *H01J 37/32633* (2013.01); *H01J 37/32733* (2013.01); *H01L 21/68721* (2013.01); *H01L 21/68735* (2013.01); *H01L 21/68742* (2013.01); *H01J 2237/2007* (2013.01); *H01J 2237/332* (2013.01)

(56) References Cited

U.S. PATENT DOCUMENTS

| | | | | |
|---|---|---|---|---|
| 5,922,133 A | * | 7/1999 | Tepman | ................. C23C 14/50 |
| | | | | 118/503 |
| 6,096,135 A | * | 8/2000 | Guo | ..................... C23C 16/455 |
| | | | | 118/715 |
| 6,231,038 B1 | * | 5/2001 | Keyser | ............. H01L 21/68721 |
| | | | | 269/100 |
| 6,296,712 B1 | * | 10/2001 | Guo | ..................... C23C 16/455 |
| | | | | 118/728 |
| 6,355,108 B1 | * | 3/2002 | Won | ........................ C23C 16/24 |
| | | | | 118/500 |
| 6,511,543 B1 | * | 1/2003 | Stauss | ............... H01L 21/68721 |
| | | | | 118/500 |
| 6,550,484 B1 | * | 4/2003 | Gopinath | .......... H01L 21/67126 |
| | | | | 134/1.2 |
| 2002/0005166 A1 | * | 1/2002 | Kisaichi | ............ H01L 21/68721 |
| | | | | 118/503 |
| 2003/0196604 A1 | | 10/2003 | Sidhwa | |
| 2005/0133164 A1 | * | 6/2005 | Fischer | ............. H01J 37/32642 |
| | | | | 156/345.51 |
| 2009/0252892 A1 | * | 10/2009 | Weichart | ........... H01L 21/67201 |
| | | | | 427/569 |
| 2009/0272647 A1 | * | 11/2009 | Young | ............... H01J 37/32623 |
| | | | | 204/298.11 |
| 2009/0294064 A1 | * | 12/2009 | Nagayama | ........ H01J 37/32623 |
| | | | | 156/345.39 |
| 2010/0326600 A1 | * | 12/2010 | Park | .................. H01J 37/32091 |
| | | | | 156/345.37 |
| 2012/0055403 A1 | * | 3/2012 | Gomi | .................. C23C 16/4404 |
| | | | | 118/725 |

FOREIGN PATENT DOCUMENTS

| | | |
|---|---|---|
| KR | 20060052443 A | 5/2006 |
| KR | 20070008369 A | 1/2007 |

\* cited by examiner

BEARING DEVICE AND PLASMA PROCESSING APPARATUS

CROSS REFERENCE TO RELATED APPLICATION

This application claims the benefit of and priority to PCT/CN2014/094359, filed on Dec. 19, 2014, entitled (translation), "BEARING DEVICE AND PLASMA PROCESSING APPARATUS," which claims the benefit of and priority to Chinese Patent Application No. 201410061908.3, filed on Feb. 24, 2014, of which is entitled (translation), "BEARING DEVICE AND PLASMA PROCESSING APPARATUS," and which are hereby incorporated by reference in their entirety into this application.

BACKGROUND

Field of the Invention

Embodiments of the invention relate to the field of microelectronics processing technology, and particularly relate to a bearing device and a plasma processing apparatus.

Description of the Related Art

In the manufacturing process of an integrated circuit, materials such as a metal layer and the like are generally deposited on a wafer by using physical vapor deposition (hereinafter, referred to as PVD) technique. During the process, a bearing device, which mainly has functions of bearing a wafer, providing a bias voltage to the wafer, cooling the wafer, cooperating with a mechanical arm to load and unload the wafer, and the like, needs to be provided in a reaction chamber.

Figure 1:
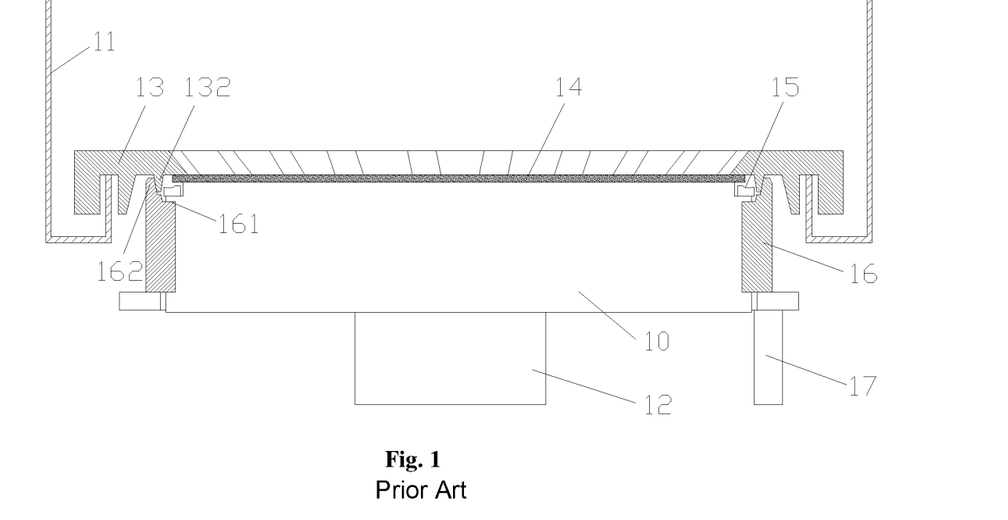
FIG. 1 is a cross-sectional view of a bearing device in the prior art.
Figure 2A:
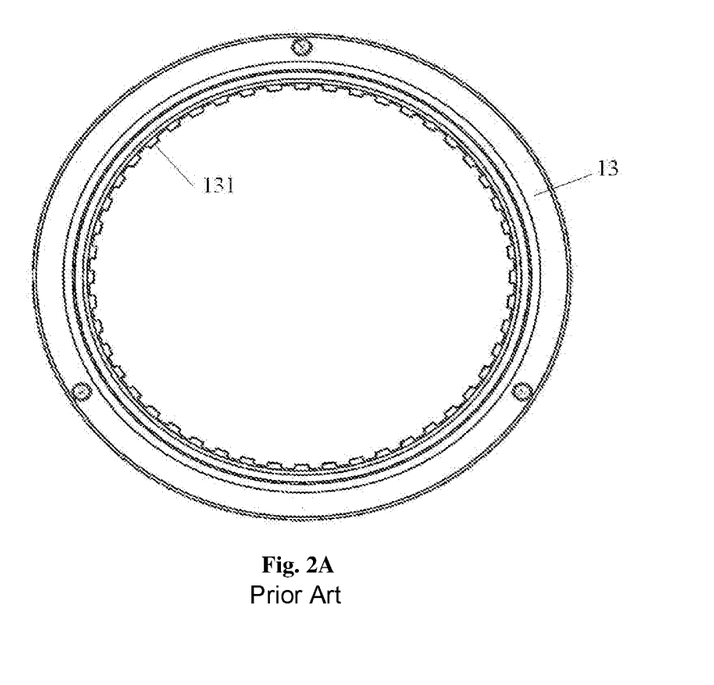
FIG. 2A is a top view of a pressing ring in the bearing device in FIG. 1.
Figure 2B:
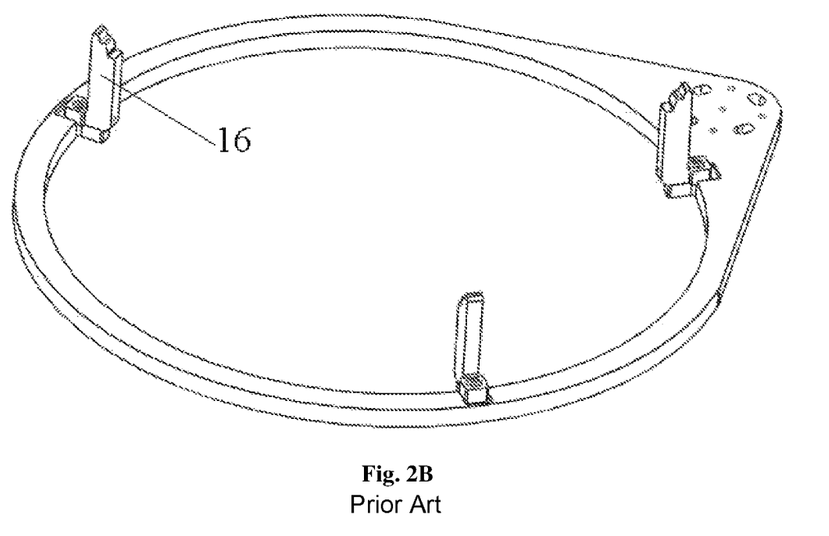
FIG. 2B is a perspective view illustrating ejector pins in the bearing device in FIG. 1.
Figure 2C:
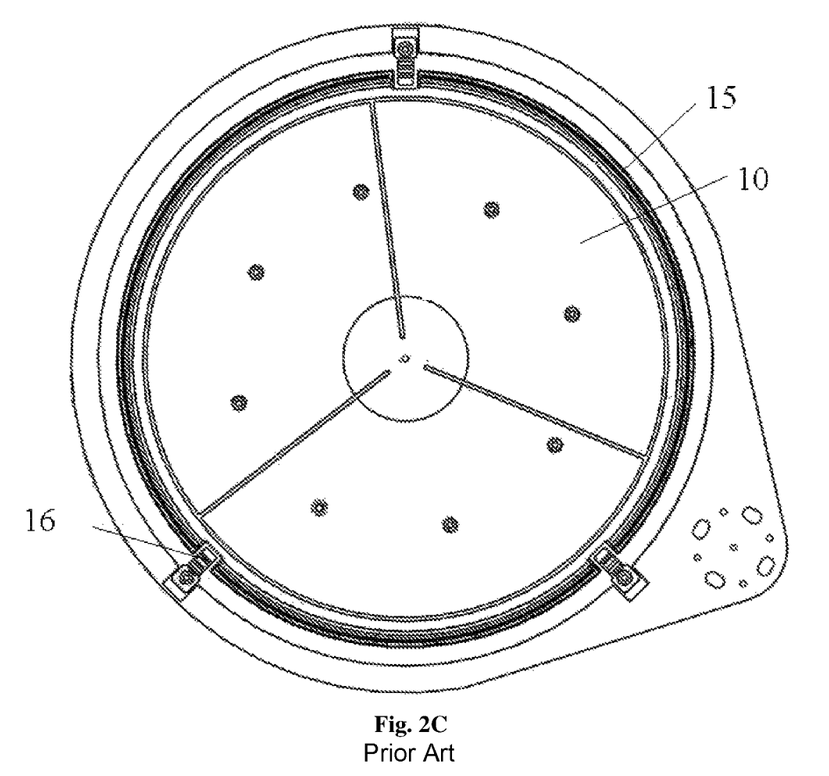
FIG. 2C is a top view of the bearing device in FIG. 1 when the tops of the ejector pins pass through a baffle ring.

FIG. 1 is a sectional view of a bearing device in the prior art. As shown in FIG. 1, the bearing device includes a base 10, a lining ring 11, a base driving mechanism 12, a pressing ring 13, a baffle ring 15, ejector pins 16 and an ejector driving mechanism 17. Here, the base 10 is used for bearing a wafer 14; the base driving mechanism 12 is used for driving the base 10 to move up and down; the pressing ring 13 has a plurality of pawls 131 (as shown in FIG. 2A) provided at intervals on an inner wall of a ring hole thereof; the lining ring 11 is used for protecting the bottom of the reaction chamber from being sputtered by plasma during the process, and supporting the pressing ring 13 when loading and unloading the wafer 14. The number of the ejector pin 16 is three (as shown in FIG. 2B), and the three ejector pins 16 are distributed along the circumferential direction of the base 10 to bear the wafer 14 when loading and unloading the wafer 14; the ejector driving mechanism 17 is used for driving the three ejector pins 16 to move up and down so that the ejector pins 16 cooperate the mechanical arm to load and unload the wafer 14; the baffle ring 15 surrounds an outer peripheral wall of the base 10 and is positioned under the pressing ring 13, and is used for preventing the plasma from passing through a gap that the pressing ring 13 and the wafer 14 form between two adjacent pawls 131; besides, the baffle ring 15 is formed of three arcuate portions arranged at intervals along the circumferential direction of the base 10, and a gap between two adjacent arcuate portions corresponds to the ejector pin 16, so that the top of the ejector pin 16 can pass through the gap when the ejector pin 16 moves up, as shown in FIG. 2C.

The working process of loading the wafer 14 will be described in detail below. Specifically, the base 10 is at a loading and unloading position for loading and unloading the wafer 14, and the ejector pins 16 are at their lowest positions at which the bearing surfaces 161, for bearing the wafer 14, of the ejector pins 16 are higher than the upper surface of the base 10; the mechanical arm places the wafer 14 on the bearing surfaces of the ejector pins 16; the ejector pin driving mechanism 17 drives the three ejector pins 16 which bear the wafer 14 to move up, and during this process, inclined surfaces 162 of the ejector pins 16 and an inclined surface 132 of the pressing ring 13 contact and move toward each other in a vertical direction, so as to indirectly achieve positioning of the pressing ring 13 and the base 10; afterwards, the ejector pins 16 stop rising; the base driving mechanism 12 drives the base 10 to move up to a process position, and during this process, the upper surface of the base 10 holds up the wafer 14 from the bearing surfaces 161 of the ejector pins 16, and continues moving up until reaching the process position, at which the pawls 131 of the pressing ring 13 clamp the edge region of the wafer 14 on the base 10 under the action of gravity of the pressing ring 13; the ejector pin driving mechanism 17 drives the three ejector pins 16 without any load to move down to return back to the lowest position, thereby accomplishing the loading of the wafer 14.

The above bearing device inevitably has the following problems in practical applications.

Firstly, the ejector pins 16 are needed not only to cooperate with the mechanical arm to load and unload the wafer 14, but also needed to achieve positioning of the pressing ring 13 and the base 10 in order to allow the coaxiality of the pressing ring 13 and the base 10 to meet process requirements, which results in troublesome working process and thus reduces process efficiency. Further, since the pressing ring 13 takes, as a reference, a center of an area surrounded by the three ejector pins 16, so as to indirectly achieve positioning of the pressing ring 13 and the base 10, it is quite difficult to ensure the coaxiality of the pressing ring 13 and the base 10 due to the difficulty in positioning between the ejector pins 16 and the base 10, which reduces the accuracy of positioning.

Secondly, because two driving mechanism, i.e., the base driving mechanism 12 and the injector pin driving mechanism 17, need to be provided to respectively drive the base 10 and the ejector pins 16 to move up and down, the bearing device has a complex structure and high manufacturing cost.

SUMMARY

Embodiments of the invention aim to solve one of the technical problems existing in the prior art and provide a bearing device and a plasma processing apparatus, which can directly achieve the positioning of the pressing ring and the base, so as to not only improve the accuracy of positioning and simplify working process, but also simplify the structure of the apparatus and reduce manufacturing cost.

According to at least one embodiment, there is provided a bearing device, including a base, a base driving mechanism, a pressing ring and a baffle ring, wherein the base is used for bearing a workpiece to be processed; the base driving mechanism is used for driving the base to move up to a process position or down to a loading and unloading position, wherein the pressing ring being is for clamping an edge region of the workpiece to be processed on the base when the base is at the process position, wherein the baffle ring surrounding an outer peripheral wall of the base and being located under the pressing ring. Surfaces of the pressing ring and the baffle ring opposite to each other comprise a pair of guiding tori, which are inclined outwardly at a same angle with respect to a centerline of the base in a vertical direction; and, during the process of driving the base to move up by the base driving mechanism, the guiding tori contact and move toward each other, so as to achieve positioning of the pressing ring and the base.

According to at least one embodiment, the surfaces of the pressing ring and the baffle ring opposite to each other farther comprise at least one pair of blocking tori surrounding the guiding tori at an outer side of the guiding tori, and when the base is at the process position, each pair of blocking tori contact each other or have therebetween a predetermined gap which plasma cannot pass through.

According to at least one embodiment, an elastic conductive member is provided on one blocking, torus of one pair of blocking tori, and when the base is at the process position, the elastic conductive member is pressed by the pair of blocking tori and thus contacts the pair of blocking tori, so that the pressing ring and the baffle ring are electrically connected.

According to at least one embodiment, a mounting groove is provided in one blocking torus of one pair of blocking tori, and a part of the conductive member is located inside the mounting groove, and the other part thereof is located outside the mounting groove.

According to at least one embodiment, the mounting groove includes a dovetailed groove, a rectangular groove, or a wedge-shaped groove.

According to at least one embodiment, a material for forming the conductive member includes a helical dielectric coil or a metal reed.

According to at least one embodiment, the conductive member has a closed ring-shaped structure, and surrounds the guiding tori at the outer side of the guiding tori.

According to at least one embodiment, a diameter of a ring hole of the pressing ring is no less than that of the workpiece to be processed, and a plurality of pawls are provided at intervals on an inner wall of the ring hole of the pressing ring, and the plurality of pawls overlay the edge region of the workpiece to be processed on the base when the base is at the process position.

According to at least one embodiment, an orthographic projection of the baffle ring on an upper surface of the base covers a gap that the ring hole of the pressing ring and an edge of the workpiece to be processed form between any two adjacent pawls, so as to prevent plasma from passing through the gap.

According to at least one embodiment, the baffle ring has a closed ring-shaped structure.

According to at least one embodiment, the bearing device further including a lining ring, which surrounds the periphery of the pressing ring; and the bottom of the lining ring bends inwardly and extends to under the pressing ring to support the pressing ring when the base is at the loading and unloading position; and when the base is at the process position, an inner wall of the lining ring and an upper surface of the pressing ring form a closed surface to prevent plasma from reaching under the base.

According to at least one embodiment, the baffle ring and the base are fixed together by a metal fastener, and the metal fastener electrically connects the baffle ring and the base.

According to at least one embodiment, the baffle ring is made of a metal material.

According to at least one embodiment, the metal material includes stainless steel, aluminum, titanium, or copper.

According to another embodiment, there is provided a plasma processing apparatus, including a reaction chamber, in which a bearing device is provided to bear a workpiece to be processed, and the bearing device is the bearing device provided by any one of the embodiments of the invention generally discussed above and described in detail below.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

Figure 3A:
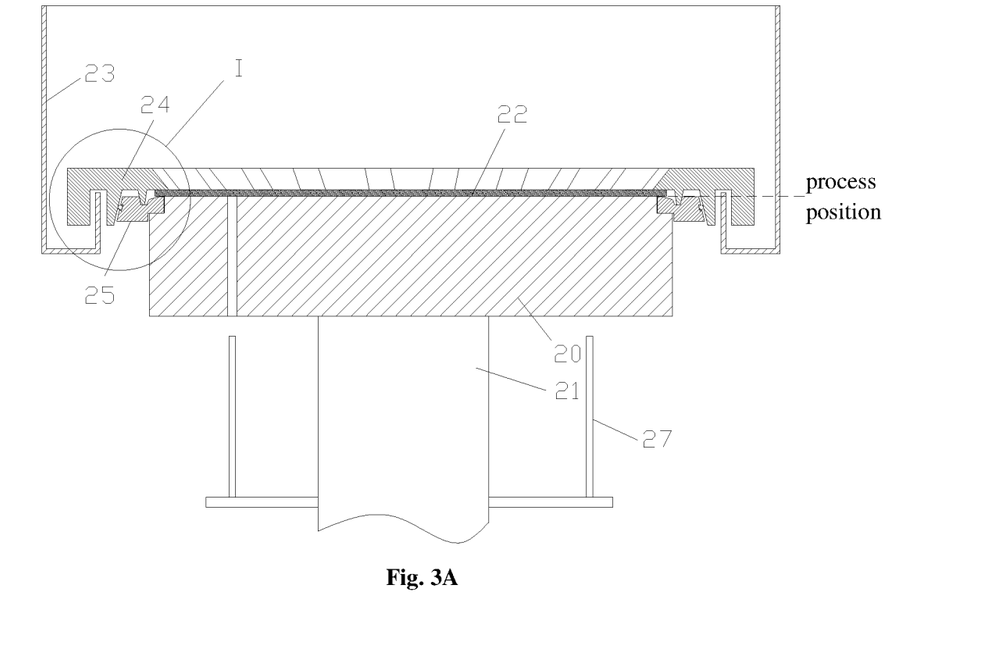
FIG. 3A is a cross-sectional view of a bearing device according to an embodiment of the invention when a base thereof is at a process position.
Figure 3B:
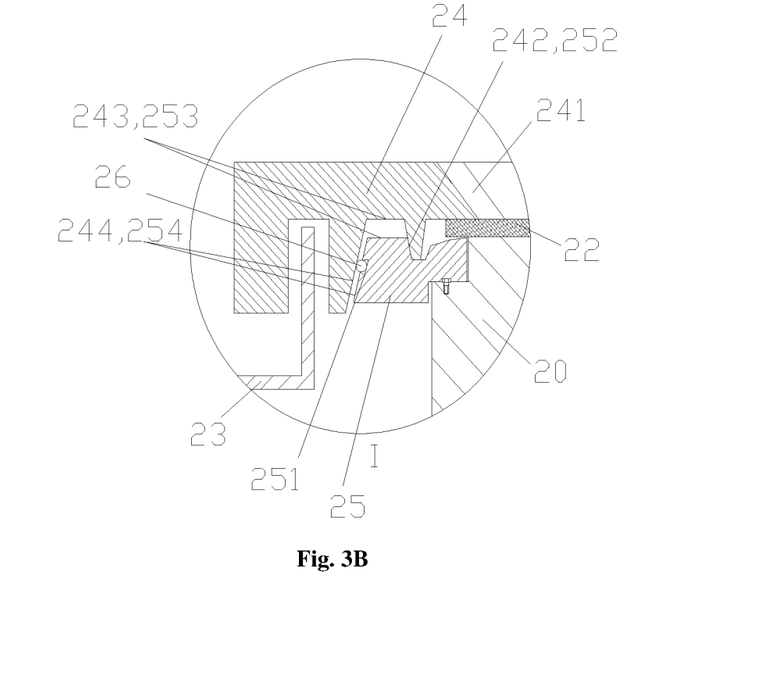
FIG. 3B is an enlarged view of an area I in FIG. 3A according to an embodiment of the invention.
Figure 4:
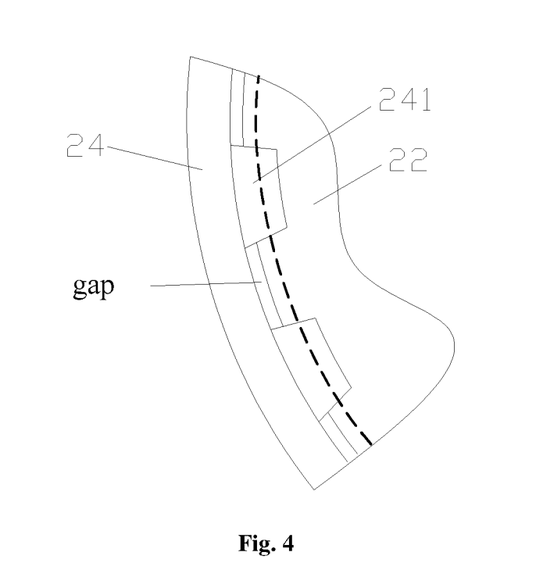
FIG. 4 is a partial top view of a bearing device according to an embodiment of the invention.
Figure 5:
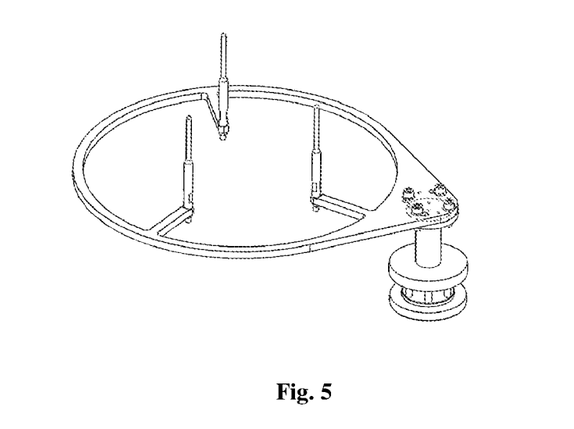
FIG. 5 is a perspective view illustrating ejector pins of the bearing device according to an embodiment of the invention.
Figure 6:
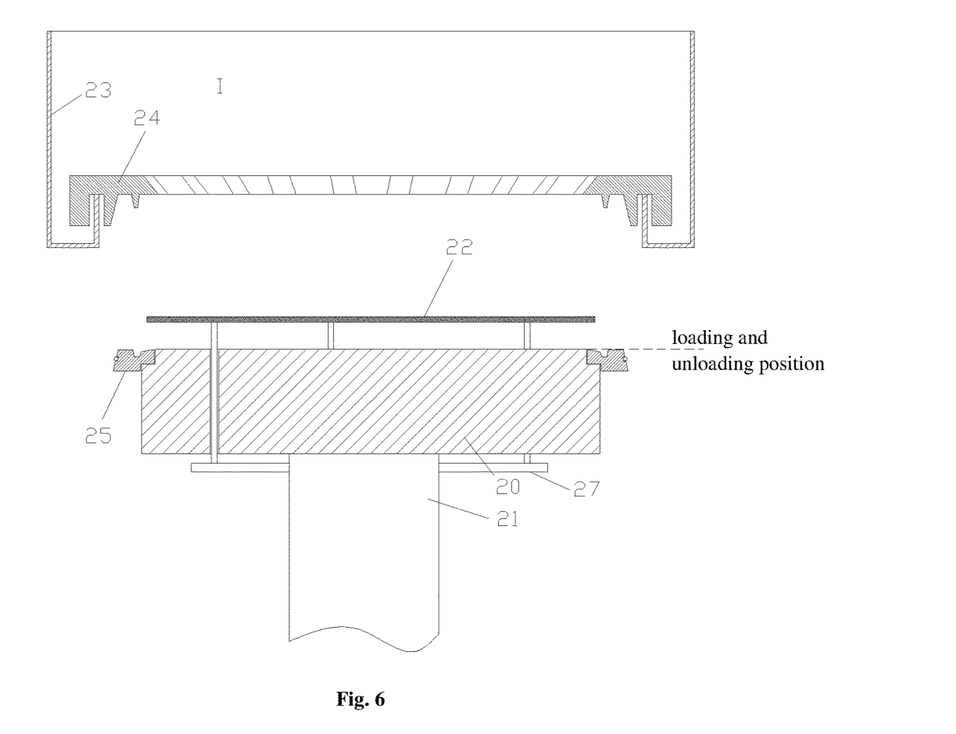
FIG. 6 is a cross-sectional view of a bearing device according to an embodiment of the invention when a base thereof is at a loading and unloading position.

FIG. 3A is a cross-sectional view of a bearing device according to an embodiment of the invention when a base thereof is at a process position. FIG. 3B is art enlarged view of an area I in FIG. 3A. FIG. 4 is a partial top view of the bearing device according to an embodiment of the invention. FIG. 5 is a perspective view illustrating ejector pins of the bearing device according to an embodiment of the invention. FIG. 6 is a cross-sectional view of the bearing device according to an embodiment of the invention when a base thereof is at a loading and unloading position. Referring to FIGS. 3A, 3B, 4, 5, and 6, the bearing device includes a base 20, a base driving mechanism 21, a lining ring 23, a pressing ring 24, a baffle ring 25 and ejector pins 27. The base 20 is used for bearing a workpiece 22 to be processed, and may be an electrostatic chuck, a mechanical chuck, or the like; the base driving mechanism 21 is used for driving the base 20 to move up to a process position or move down to a loading and unloading position. The so-called process position refers to a position where an upper surface, for bearing a wafer, of the base 20 is located when a process is performed on the workpiece 22 to be processed, as shown in FIG. 3A; the so-called loading and unloading position refers to a position where the upper surface of the base 20 is located when the workpiece 22 to be processed is being loaded or unloaded, as shown in FIG. 6.

According to at least one embodiment, the pressing ring 24 is used for clamping an edge region of the workpiece 22 to be processed on the base 20 when the base 20 is at the process position. In the embodiment, as shown in FIG. 4, a diameter of a ring hole of the pressing ring 24 is no less than that of the workpiece 22 to be processed, and a plurality of pawls 241 are provided at intervals on an inner wall of the ring hole of the pressing ring 24, and overlay the edge region of the workpiece 22 to be processed on the base 20 when the base 20 is at the process position. Since the diameter of the ring hole of the pressing ring 24 is no less than that of the workpiece 22 to be processed, only the pawls 241 overlay the edge region of the workpiece 22 to be processed when the workpiece 22 to be processed and the pressing ring 24 are arranged coaxially, so that portions, between any two adjacent pawls 241, of the edge region of the workpiece 22 to be processed can be exposed to plasma environment, that is, an area, exposed to the plasma environment, of the workpiece 22 to be processed is increased, which can facilitate performing a subsequent plating process.

According to at least one embodiment, the baffle ring 25 surrounds an outer peripheral wall of the base 20 and under the pressing ring 24, and a projection of the baffle ring 25 on a plane where the upper surface of the base 20 is located covers a gap that the ring hole of the pressing ring 24 and the edge of the workpiece 22 to be processed form between any two adjacent pawls 241 (as shown in FIG. 4), so as to prevent plasma from passing through the gap.

Further, surfaces of the pressing ring 24 and the baffle ring 25 opposite to each other include a pair of guiding tori (242, 252), which are inclined outwardly at a same angle with respect to a centerline of the base 20 in the vertical direction. The pair of guiding tori (242, 252) may be provided in such a manner that an annular protrusion and an annular recess are respectively provided on the surfaces of the pressing ring 24 and the baffle ring 25 opposite to each other (i.e., on a lower surface of the pressing, ring 24 and an upper surface of the baffle ring 25) in a corresponding manner, the annular recess can accommodate the annular protrusion, and respective outer side walls of the annular protrusion and the annular recess away from the center of the base 20 are a pair of inclined surfaces inclined outwardly at a same angle with respect to the centerline of the base 20 in the vertical direction, and the pair of inclined surfaces are the guiding tori for positioning the pressing ring 24 and the base 20. It can be understood that, the so-called the positioning of the pressing ring 24 and the base 20 means making the centerline of the pressing ring 24 in the vertical direction and the centerline of the base 20 in the vertical direction coincide with each other; and the so-called annular protrusion and the annular recess means that the protrusion and the recess are each configured to have a closed ring shape surrounding the base 20.

During the process of driving, by the base driving mechanism 21, the base 20 to move up, the guiding tori (242, 252) contact and move toward each other, that is, the guiding tori (242, 252) slide toward each other, and in this case, the pressing ring 24 automatically correct the coaxiality of the pressing ring 24 and the base 20 under its own gravity, so that the positioning of the pressing ring 24 and the base 20 can be directly achieved, which, as compared with the ease where the positioning of the pressing ring and the base is indirectly achieved by using the positioning of the ejector pins and the pressing ring in the prior art, can improve the coaxiality of the pressing ring 24 and the base 20, and further enhance the accuracy of positioning. In addition, since the process of positioning the pressing ring by raising the ejector pins in the prior art is omitted, the working process can be simplified, and thus the working efficiency can be improved.

According to at least one embodiment, the surfaces of the pressing ring 24 and the baffle ring 25 opposite to each other further includes at least one pair of blocking tori surrounding an outer side of the above guiding tori (242, 252), and when the base 20 is at the process position, each pair of blocking tori contact each other, or have a predetermined gap through which plasma cannot pass. For example, as shown in FIG. 3B, two pairs of blocking tori (243, 253) and (244, 254) are provided at the outer side of the above guiding tori (242, 252), wherein, the blocking tori (243, 253) are annular portions, at the outer side of the guiding tori (242, 252), of the lower surface of the pressing ring 24 and the upper surface of the baffle ring 25; the blocking torus 254 is an outer peripheral wall surface of the baffle ring 25, an annular protrusion is correspondingly provided on the lower surface of the pressing ring 24 and at the outer side of the baffle ring 25, and the blocking torus 244 is an inner peripheral wall, opposite to the blocking torus 254, of the annular protrusion extending downwardly along the blocking torus 254.

According to at least one embodiment, with the blocking tori, an abutting surface or a channel (the width of the channel is set such that the plasma cannot pass through the channel) which blocks the plasma may be formed between the surfaces of the pressing ring 24 and the baffle ring 25 opposite to each other, so that the plasma can be prevented from passing therethrough, and further, sediments attached to the bottom of the reaction chamber and elements on the bottom of the reaction chamber can be avoided. It can be understood that, the arrangement of the blocking tori may be set freely according to specific conditions, as long as an abutting surface or a channel which can block the plasma from passing therethrough is formed between the surfaces of the pressing ring 24 and the baffle ring 25 opposite to each other; preferably, more than two pairs of blocking tori are provided, and every adjacent blocking tori are set to have a certain angle therebetween, so that a curved abutting surface or a curved channel is formed between the surfaces of the pressing ring 24 and the baffle ring 25 opposite to each other, and thus plasma can be better blocked from passing.

According to at least one embodiment, as shown in FIG. 3B, an elastic conductive member 26 is provided on one of the blocking tori (244, 254), (i.e., on the blocking torus 254), the conductive member 26 has a closed ring-shaped structure, that is, the conductive member 26 is configured to be a closed ring surrounding the outer side of the guiding tori (242, 252), and the conductive member 26 is preferably made of a conductive material that can be deformed in the radial direction of the base 20 when pressed in said radial direction. For example, the conductive member 26 may be a closed ring-shaped structure formed by a helical dielectric coil, like a handset cord of a telephone, or may be an elastic ring-shaped structure formed by a metal reed. In this case, when the base 20 is at the process position, the conductive member 26 is pressed by the pair of blocking tori (244, 254) and thus contacts the pair of blocking tori (244, 254), so that the pressing ring 24 and the baffle ring 25 can be electrically connected. Further, the baffle ring 25, the pressing ring 24 and the base 20 are made of a metal material such as a stainless steel (e.g., SUS304, SUS316L, etc.), aluminum, titanium, copper, or the like, and a metal fastener (not shown in figures) is provided to fix the baffle ring 25 and the base 20 together and electrically connect the baffle ring 25 with the base 20. It can be seen that, by means of the conductive member 26 and the metal fastener, the pressing ring 24, the baffle ring 25 and the base 20 can be electrically connected and thus have a same potential, so that spark phenomenon, which may cause the workpiece 22 to be processed to crack, can be avoided from occurring between the three during the process.

Also, the conductive member 26 may be mounted on the blocking torus 254 in such a specific way that a mounting groove 251, which may be a groove (e.g., a dovetailed groove, a rectangular groove, a wedge-shaped groove, etc.) in which the conductive member 26 can be fixed, is provided in the blocking torus 254, further, a part of the conductive member 26 is located inside the mounting groove 251, and the other part thereof is located outside the mounting groove 251 so that the conductive member 26 can contact the blocking tori (244, 254). Needless to say, in practical applications, the mounting way of the conductive member 26 is not limited thereto, and any mounting way in which it can be guaranteed that the conductive member 26 can contact a pair of blocking tori Where the conductive member 26 is located may be adopted. In addition, the conductive member 26 may be provided on any pair of blocking tori.

According to at least one embodiment, the specific structure of the ejector pins 27 is shown in FIGS. 3A, 5, and 6, the number of the ejector pins 27 is at least three, the at least three ejector pins 27 are provided below the base 20 and distributed along the peripheral direction of the base 20, and when the base 20 is at the loading and unloading position, tops of the at least three ejector pins 27 are higher than the upper surface of the base 20, so as to support the workpiece 22 to be processed.

According to at least one embodiment, in the bearing device, by means of the guiding tori (242, 252) of the pressing ring 24 and the baffle ring 25 that contact and move toward each other, the positioning of the pressing ring 24 and the base 20 is directly achieved by using the gravity of the pressing ring 24, without using the ejector pins 27 for positioning, so both the process of raising the ejector pins 27 for positioning and the ejector pin driving mechanism for driving the ejector pins 27 to move up and down can be omitted, which can not only simplify working process and improve working efficiency, but also simplify the structure of the bearing device and reduce manufacturing cost.

In addition, because there is no need for the ejector pins 27 to move up and down throughout the process, the baffle ring 25 can have a closed ring-shaped structure, and does not need to be divided into a plurality of arcuate segments to solve the problem that the tops of the ejector pins 27 are disturbed by the baffle 25 when the ejector pins 27 move up. Moreover, as compared with the baffle ring divided into a plurality of arcuate segments, the baffle ring 25 having a closed ring-shaped structure can have a better blocking effect and is thus more conducive to preventing the plasma from being sputtered to the bottom of the reaction chamber to result in sediments attached to the bottom of the reaction chamber and elements on the bottom of the reaction chamber.

According to at least one embodiment, the lining ring 23 surrounds the periphery of the pressing ring 24, and the bottom of the lining ring 23 bends inwardly and extends to under the pressing ring 24 to support the pressing ring 24 when the base 20 is at the loading and unloading position; and when the base 20 is at the process position, the inner wall of the lining ring 23 and the upper surface of the pressing ring 24 form a closed surface to prevent the plasma from reaching under the base 20. In the embodiment, an annular recess is formed on the lower surface of the pressing ring 24, the bottom of the lining ring 23 bends inwardly and extends into the annular recess, which can cause the bottom of the liming ring 23 and the annular recess of the pressing ring 24 to be nested within each other, so that the inner wall of the lining ring 23 and the upper surface of the pressing ring 24 form a closed surface. Needless to say, in practical applications, any other form may be adopted to allow the inner wall of the lining ring 23 and the upper surface of the pressing ring 24 to form a closed surface.

According to at least one embodiment, the process of loading and unloading the workpiece to be processed will be described in detail below in conjunction with FIGS. 3A and 6. Specifically, the base 20 descends to the loading and unloading position while being driven by the base driving mechanism 21, and at this time, the ejector pins 27 is higher than the upper surface of the base 20; the mechanical arm for transferring the workpiece 22 to be processed places the workpiece 22 to be processed on tops of the ejector pins 27; the base 20 rises to the process position while being driven by the base driving mechanism 21, during this process, the guiding tori (242, 252) contact and move toward each other, so as to achieve the positioning of the pressing ring 24 and the base 20, and in the meanwhile, the pressing ring 24 is jacked up a little by the baffle ring 25 so that the pawls 241 of the pressing ring 24 clamp the edge region of the workpiece 22 to be processed on the base 20, and the workpiece 22 to be processed is thus fixed to the upper surface of the base 20, thereby completing the loading of the workpiece 22 to be processed.

According to at least one embodiment, in the process of unloading the workpiece 22 to be processed, the base 20 descends to the loading and unloading position when being driven by the base driving mechanism 21, and during this process, the workpiece 22 to be processed is held up by the ejector pins 27 when passing the tops of the ejector pins 27, that is, the ejector pins 27 bear the workpiece 22 to be processed at this time; the mechanical arm moves to the bottom of the workpiece 22 to be processed and takes out the workpiece 22 to be processed, thereby completing the unloading of the workpiece 22 to be processed.

According to another embodiment, there is provided a plasma processing apparatus including a reaction chamber in which a bearing device for bearing a workpiece to be processed is provided, and the bearing device is the bearing device provided by any one of the above embodiments of the invention.

In the plasma processing apparatus according to at least one embodiment of the invention, the bearing device provided by the embodiment of the invention is adopted, which can not only simplify working process and improve working efficiency, but also simplify the structure of the bearing device and reduce manufacturing cost.

Embodiments of the invention provide non-obvious advantages over the conventional art. For example, in the bearing device according to various embodiments of the invention, surfaces of the pressing ring and the baffle ring opposite to each other include a pair of guiding tori, which are inclined outwardly at a same angle with respect to a centerline of the base in a vertical direction, and during the process of lifting the base to the process position, the guiding tori of the pressing ring and the baffle ring contact and move toward each other, so the positioning of the pressing ring and the base can be achieved under the gravity of the pressing ring which, as compared with the case where the positioning of the pressing ring and the base is indirectly achieved by using the positioning of the ejector pins and the pressing ring in the prior art, can improve the coaxiality of the pressing ring and the base, and further enhance the accuracy of positioning; in addition, since the ejector pins are not needed in the positioning, both the process of raising the ejector pins for positioning and the ejector pin driving mechanism for driving the ejector pins to move up and down can be omitted, which can not only simplify working process and improve working efficiency, but also simplify the structure of the bearing device and reduce manufacturing cost.

In the plasma processing apparatus according to at least one embodiment of the invention, the bearing device provided according to an embodiment of the invention is adopted, which can not only simplify working process and improve working efficiency, but also simplify the structure of the bearing device and reduce manufacturing cost.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed. According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

It can be understood that, the above implementations are merely exemplary implementations used for explaining the principle of the embodiments of the invention, but the embodiments of the invention is not limited thereto. For those skilled in the art, various modifications and improvements may be made without departing from the spirit and essence of the embodiments of the invention, and these modifications and improvements are also deemed as falling within the protection scope of the embodiments of the invention.

The invention claimed is:

1. A bearing device, comprising:
a base configured to bear a workpiece to be processed;
a pressing ring configured to clamp an edge region of the workpiece to be processed on the base when the base is at a process position;
a baffle ring fixed to the base, configured to surround an outer peripheral wall of the base, and located under the pressing ring, a diameter of a ring hole of the baffle ring being smaller than a diameter of a ring hole of the pressing ring to prevent plasma from passing through a gap between the workpiece and the pressing ring, and
an elastic conductive ring provided on the baffle ring, wherein:
a pair of guiding tori, and at least a first pair of blocking tori and a second pair of blocking tori are formed at a lower side of the pressing ring and an upper side of the baffle ring,
the lower side of the pressing ring comprises an annular protrusion protruded from a first lower surface of the pressing ring, and an upper side of the baffle ring comprises an annular recess recessed from a first upper surface of the baffle ring, wherein the first lower surface and the first upper surface are spaced apart by a first predetermined gap and form the first pair of blocking tori,
the pair of guiding tori includes the annular protrusion and the annular recess, configured to align the pressing ring with the base when the base is moved to the process position, each outer side wall of the annular protrusion and the annular recess having a first angle with respect to a centerline of the base in a vertical direction,
outer side walls of the annular protrusion and the annular recess have matching shapes, capable of abutting with each other at the process position to accommodate the annular protrusion into the annular recess,
the second pair of blocking tori includes a second lower surface of the pressing ring and a second upper surface of the baffle ring, fully spaced apart by a second predetermined gap at the process position and each having a non-zero angle with respect to the centerline of the base in the vertical direction, and at the process position, the elastic conductive ring is positioned at least partially in the second predetermined gap.

2. The bearing device according to claim 1, wherein, when the base is at the process position, the elastic conductive ring is pressed by the second lower surface of the pressing ring and the second upper surface of the baffle ring of the second pair of blocking tori, and the pressing ring and the baffle ring are electrically connected through the elastic conductive ring.

3. The bearing device according to claim 2, wherein a mounting groove is provided in the second upper surface of the baffle ring of the second pair of blocking tori, and a portion of the elastic conductive ring is located inside the mounting groove, and another portion of the elastic conductive ring is located outside the mounting groove.

4. The bearing device according to claim 3, wherein the mounting groove includes a dovetailed groove, a rectangular groove, or a wedge-shaped groove.

5. The bearing device according to claim 2, wherein a material for forming the elastic conductive ring includes a helical dielectric coil or a metal reed.

6. The bearing device according to claim 2, wherein the elastic conductive ring has a closed ring-shaped structure and surrounds the pair of guiding tori at the outer side of the pair of guiding tori.

7. The bearing device according to claim 1, wherein the diameter of the ring hole of the pressing ring is equal to or greater than a diameter of the workpiece to be processed, and a plurality of pawls are provided at intervals on an inner wall of the ring hole of the pressing ring and overlay the edge region of the workpiece to be processed on the base when the base is at the process position.

8. The bearing device according to claim 7, wherein an orthographic projection of the baffle ring on an upper surface of the base covers a gap that the ring hole of the pressing ring and an edge of the workpiece to be processed form between any two adjacent pawls, so as to prevent the plasma from passing through the gap.

9. The bearing device according to claim 8, wherein the baffle ring has a closed ring-shaped structure.

10. The bearing device according to claim 1, wherein the bearing device further comprises:

a lining ring, which surrounds a periphery of the pressing ring, and a bottom of the lining ring bends inwardly and extends to position under the pressing ring to support the pressing ring when the base is at a loading and unloading position; and when the base is at the process position, an inner wall of the lining ring and an upper surface of the pressing ring form a closed surface to prevent the plasma from reaching under the base.

11. The bearing device according to claim 1, wherein the baffle ring and the base are fixed together by a metal fastener, and the metal fastener electrically connects the baffle ring and the base.

12. The bearing device according to claim 1, wherein the baffle ring is made of a metal material.

13. The bearing device according to claim 12, wherein the metal material includes stainless steel, aluminum, titanium, or copper.

14. A plasma processing apparatus, comprising:

a reaction chamber including a bearing device, wherein the bearing device is configured to bear a workpiece to be processed, the bearing device comprising:

a base configured to bear the workpiece;

a pressing ring configured to clamp an edge region of the workpiece on the base when the base is at a process position;

a baffle ring fixed to the base, located under the pressing ring; and an elastic conductive member provided on the baffle ring, wherein:

a pair of guiding tori, and at least a first pair of blocking tori and a second pair of blocking tori are formed at a lower side of the pressing ring and an upper side of the baffle ring, the lower side of the pressing ring comprises an annular protrusion protruded from a first lower surface of the pressing ring, and an upper side of the baffle ring comprises an annular recess recessed from a first upper surface of the baffle ring, wherein the first lower surface and the first upper surface are spaced apart by a first predetermined gap and form the first pair of blocking tori, the pair of guiding tori includes the annular protrusion and the annular recess, configured to align the pressing ring with the base when the base is moved to the process position, outer side walls of the annular protrusion and the annular recess have matching shapes, capable of abutting with each other at the process position to accommodate the annular protrusion into the annular recess, the second pair of blocking tori includes a second lower surface of the pressing ring and a second upper surface of the baffle ring, fully spaced apart by a second predetermined gap at the process position and each having a non-zero angle with respect to the centerline of the base in the vertical direction, and at the process position, the elastic conductive member is positioned at least partially in the second predetermined gap.

* * * * *